US011824485B2

(12) United States Patent
Brown et al.

(10) Patent No.: US 11,824,485 B2
(45) Date of Patent: Nov. 21, 2023

(54) PHOTOVOLTAIC ROOF COVERING AND METHOD OF MANUFACTURE

(71) Applicant: Roof Tiles Technology Limited, Carlisle (GB)

(72) Inventors: Stewart William Brown, Carlise (GB); Antonio Lanzoni, Rovigo (IT)

(73) Assignee: Roof Tiles Technology Limited

( * ) Notice: Subject to any disclaimer, the term of this patent is extended or adjusted under 35 U.S.C. 154(b) by 95 days.

(21) Appl. No.: 17/606,683

(22) PCT Filed: Apr. 24, 2020

(86) PCT No.: PCT/GB2020/051015
§ 371 (c)(1),
(2) Date: Oct. 26, 2021

(87) PCT Pub. No.: WO2020/217064
PCT Pub. Date: Oct. 29, 2020

(65) Prior Publication Data
US 2022/0200518 A1 Jun. 23, 2022

(30) Foreign Application Priority Data

Apr. 26, 2019 (GB) .................................... 1905849
Sep. 18, 2019 (GB) .................................... 1913471

(51) Int. Cl.
*H02S 20/25* (2014.01)
*H02S 30/10* (2014.01)
*E04D 1/00* (2006.01)

(52) U.S. Cl.
CPC ............ *H02S 20/25* (2014.12); *E04D 1/2984* (2019.08); *H02S 30/10* (2014.12)

(58) Field of Classification Search
CPC ........ H02S 20/25; H02S 30/10; E04D 1/2984
See application file for complete search history.

(56) References Cited

U.S. PATENT DOCUMENTS 6,338,230 B1 1/2002 Davey
8,505,249 B2 8/2013 Geary
(Continued)

FOREIGN PATENT DOCUMENTS

DE 0 2012 008852 11/2013
EP 1 184 526 3/2002
(Continued)

OTHER PUBLICATIONS

Booth, U.S. Appl. No. 62/852,650, pp. 1-41 (filed 2019).*
(Continued)

*Primary Examiner* — Jayne L Mershon
(74) *Attorney, Agent, or Firm* — Kim IP Law Group LLC

(57) ABSTRACT

The invention relates to a photovoltaic roof covering comprising a base tile having an anchor portion to anchor the base tile to part of a roof in use and wherein a spacer is provided to support a portion of another overlaid base tile in use by spacing the overlaid tile from the photovoltaic panel. Also included is a roof covering with a base tile having a first planar upper face and a second opposing lower face. The base tile comprises an anchor portion located towards one end of the second lower face of the base tile and is configured to anchor the base tile to part of a roof structure in use. A connecting portion is configured to connect the base tile to an adjacent base tile in use. The roof covering further comprises a rectilinear cover panel having upper and lower opposing faces and a width that is smaller relative to a width of the first planar upper face of the base tile. The base tile and the cover panel are arranged such that side edges of the cover panel are offset relative to side edges of the first upper planar face of the base tile. An inset is thereby created at one side edge and an overhang of the cover panel at the opposing side edge, wherein the base tile and the cover portion are coupled in this offset configuration.

19 Claims, 12 Drawing Sheets

(56) References Cited

U.S. PATENT DOCUMENTS

| | | | |
|---|---|---|---|
| 9,911,891 B1* | 3/2018 | Hall | H02S 20/25 |
| 2008/0302031 A1 | 12/2008 | Bressler | |
| 2010/0059104 A1* | 3/2010 | Geary | E04D 11/00 |
| | | | 136/251 |
| 2011/0024050 A1* | 2/2011 | Booth | H01L 31/048 |
| | | | 156/349 |
| 2014/0090695 A1 | 4/2014 | Rodrigues et al. | |
| 2015/0083197 A1* | 3/2015 | Langmaid | F24S 25/61 |
| | | | 136/251 |
| 2016/0181446 A1 | 6/2016 | Kalkanoglu et al. | |
| 2017/0070182 A1* | 3/2017 | Tan | F24S 25/20 |
| 2020/0263905 A1* | 8/2020 | Daniels | E04D 1/29 |

FOREIGN PATENT DOCUMENTS

| | | |
|---|---|---|
| EP | 2 230 362 | 9/2010 |
| GB | 2463335 | 3/2010 |
| JP | 10183870 | 7/1998 |
| WO | 2000/030184 | 5/2000 |
| WO | WO0030184 * | 5/2000 |
| WO | 2009/108874 | 9/2009 |
| WO | 2011/002433 | 1/2011 |
| WO | 2011/048565 | 4/2011 |
| WO | 2012/095588 | 7/2012 |
| WO | 2018/158470 | 9/2018 |
| WO | 2018/217413 | 11/2018 |

OTHER PUBLICATIONS

GB Search Report dated Feb. 18, 2020 in connection with related GB Application No. GB1913506.0 (4 pages).
GB Search Report dated Feb. 18, 2020 in connection with related GB Application No. GB1913471.7 (4 pages).
International Search Report and Written Opinion for International PCT Application PCT/GB2020/051015, dated Jul. 3, 2020 (12 pages).

* cited by examiner

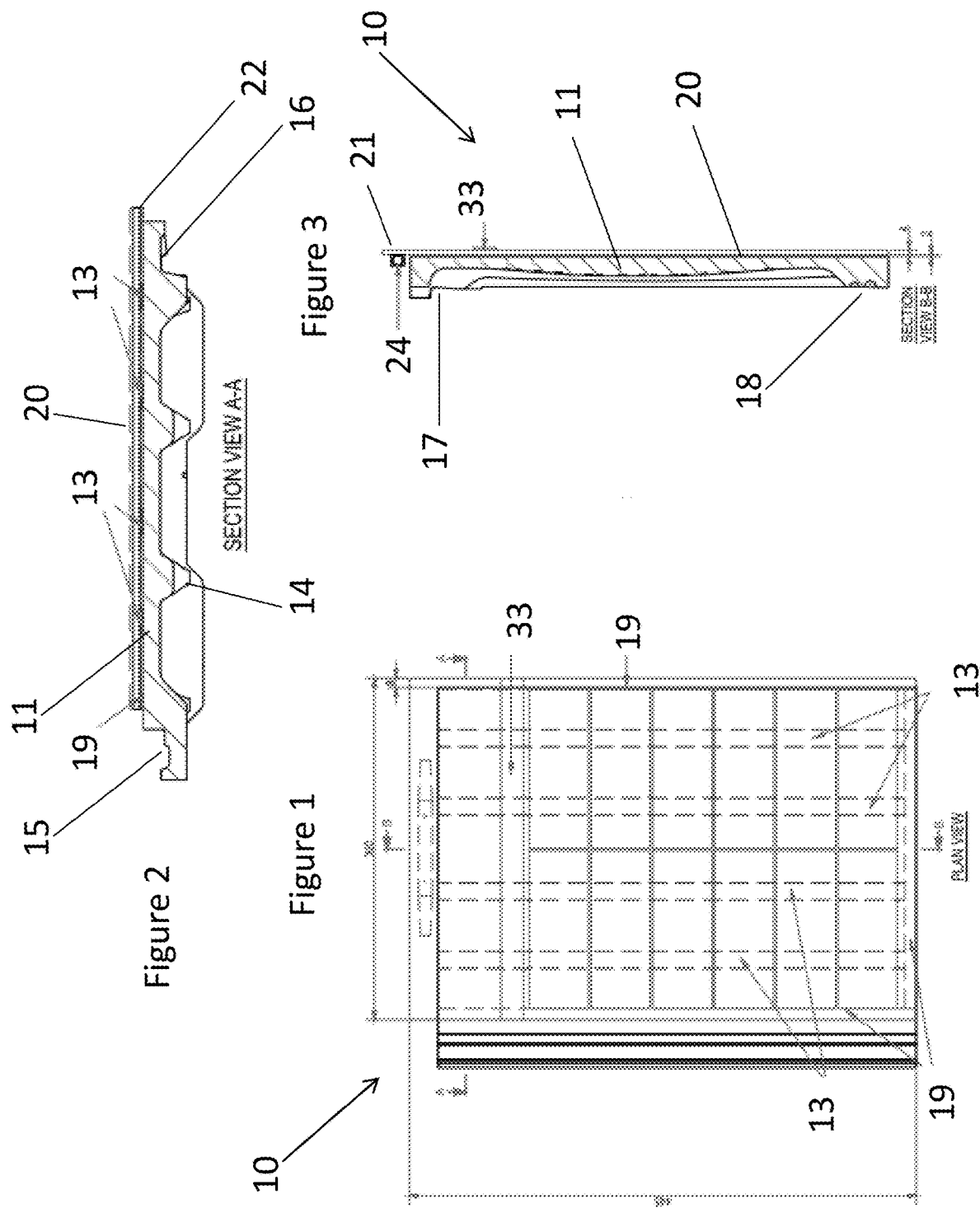

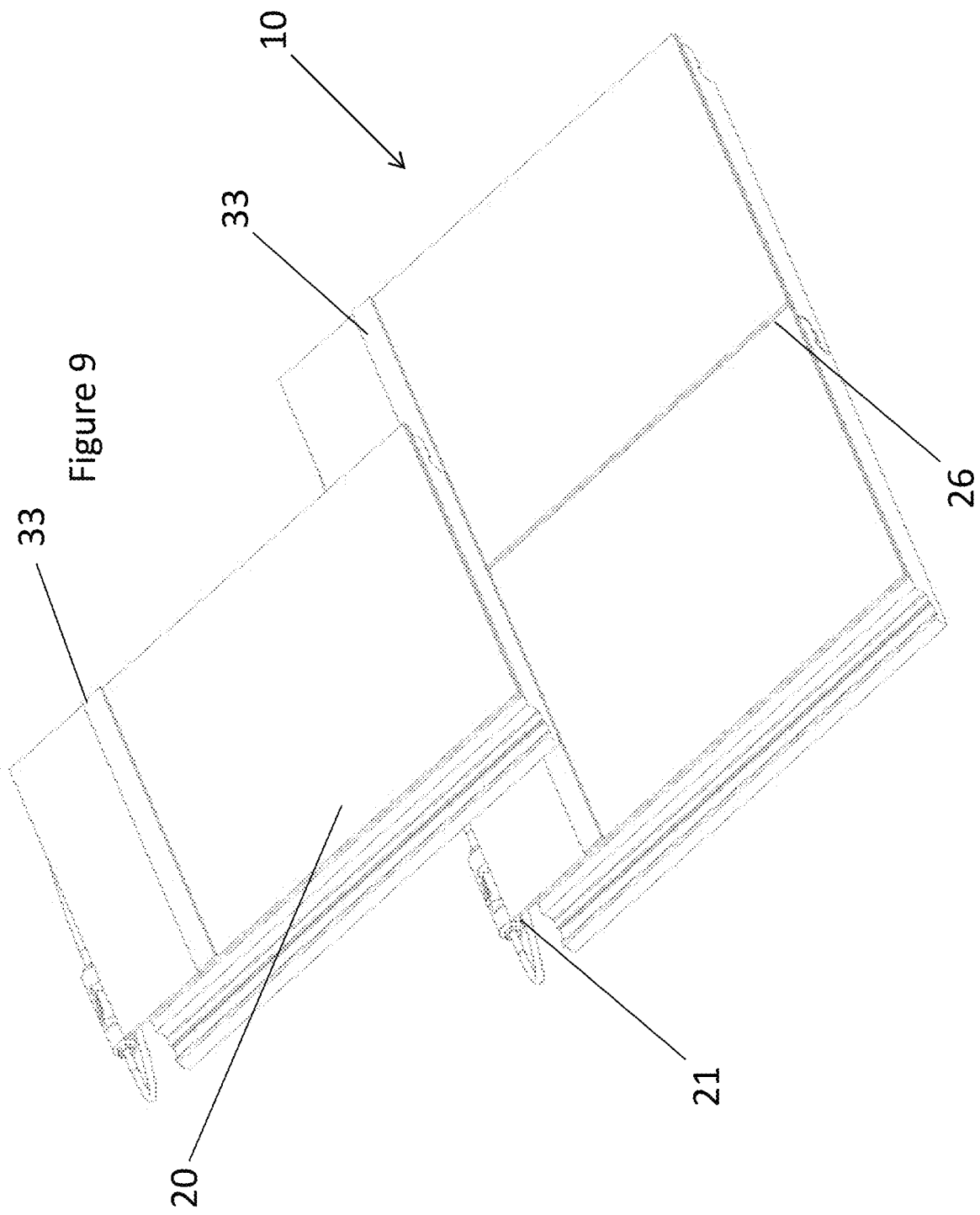

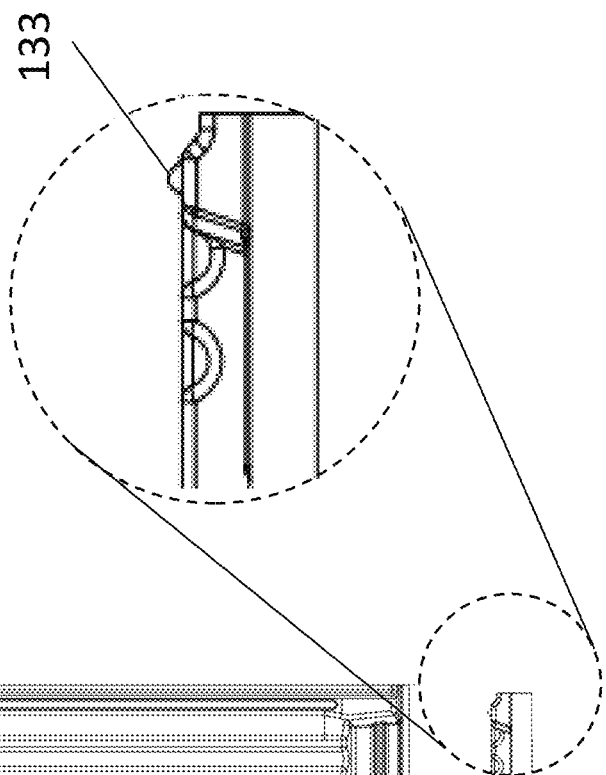
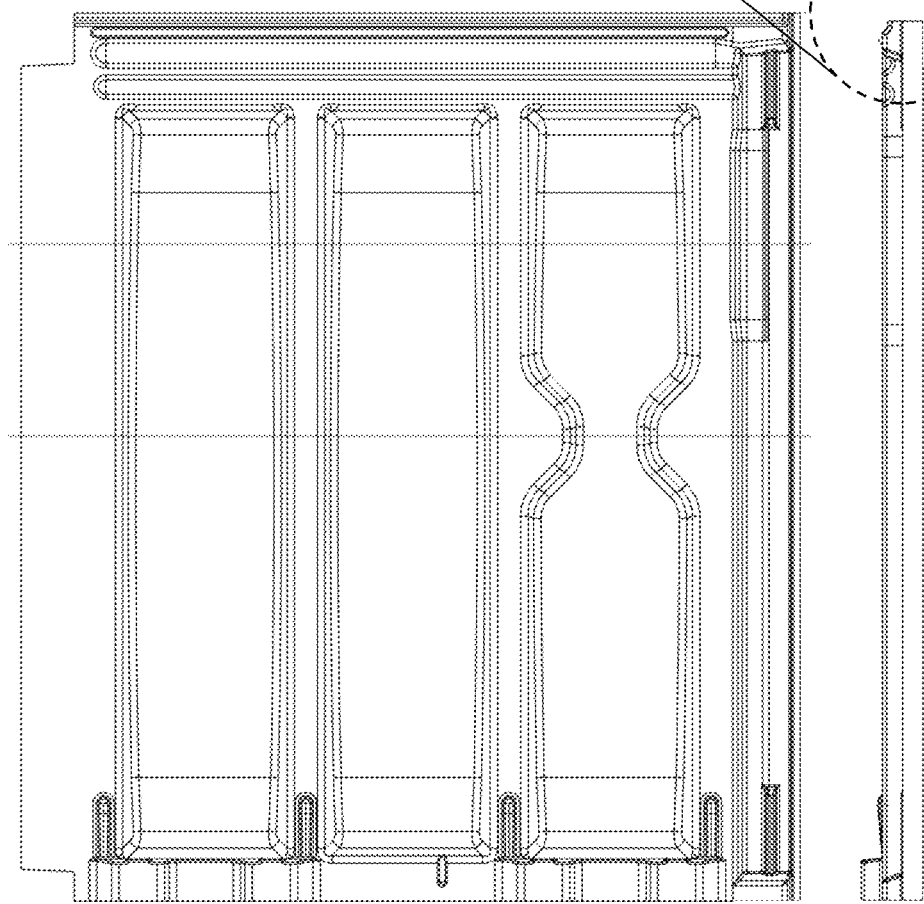

PLAN VIEW

SIDE ELEVATION

PHOTOVOLTAIC ROOF COVERING AND METHOD OF MANUFACTURE

The present invention relates to a photovoltaic roof covering and a method of manufacture for the same, particularly, but not exclusively, a photovoltaic roof tile that comprises a solar element, while complying with existing regulations and specifications for approved roof tiles.

In accordance with global demand for clean energy generation, there is an increasing trend towards use of solar power to generate electricity. Photovoltaic cells or solar cells convert light energy to electrical energy and are increasingly used for generation of energy in domestic and commercial settings. Solar cells are maximally efficient when located in an elevated position in direct sunlight. Therefore, optimal positioning of solar panels on a rooftop is beneficial. Securing solar panels to rooftops can be problematic because the solar panels are fragile and easily damaged but must be securely attached to a roof to withstand prevailing weather. In addition, provision must be made to harvest the electrical energy generated from solar cells by accommodating wires, cables and electronics within the roof structure to provide a means of drawing power from the solar roof covering. Again, there is a need to protect these electronic components from prevailing weather. Conventionally this may be achieved by providing a hole through the body of the roof tile and passing a cable from the rear of the solar panel to the electronics mounted underneath the roof tile; however, this can weaken the structural integrity of the roof tile and can result in an increased risk of leaks. Furthermore, there are certain aesthetic factors to consider. Roof coverings are often required to be uniform and discrete in appearance. It is common for solar panels to be used only over a suitable part of a roof; often, next to standard roof tiles, resulting in two types of roof covering in adjacent relation. Such juxtaposition of mismatching roof coverings can adversely impact the overall appearance of a roof. Given the large areas over which roof coverings are utilised and the competitive commercial market, there is also a requirement to minimise costs associated with such roof coverings.

EP 1184526 describes a photovoltaic cell module tile in which a photovoltaic cell module is positioned within a recess in a top surface of the tile body. The photovoltaic cell module is retained within the recess by a fitting section and a pressure member which retain the photovoltaic cell module within the recess.

In view of the above, it is an object of the present invention to provide a solution that alleviates at least one of the aforementioned problems in relation to solar roof coverings.

According to a first aspect of the invention, there is provided a photovoltaic roof covering comprising:
- a base tile having an anchor portion, wherein the anchor portion is configured to anchor the base tile to part of a roof in use;
- a photovoltaic panel having a first lower face that is configured to abut the base tile and a second opposing upper face that is arranged to receive light;
- wherein the base tile and the photovoltaic panel are coupled to one another; and
- a spacer configured to support a portion of another overlaid base tile in use by spacing the overlaid tile from the photovoltaic panel;
- wherein the spacer is adhesively bonded to the second upper face towards an upper leading end of the photovoltaic panel.

Optionally, the base tile is a standard tile. The base tile may conform to any predetermined specification for approved roof tiles. Thus, the dimensions, materials, physical characteristics, strength and shape of the base tiles may comply with appropriate regulations governing roof tiles in any appropriate country, jurisdiction or region.

It may be advantageous that the base tile is a standard tile rather than a specially adapted or modified tile since this removes any additional requirement for the photovoltaic roof covering to fulfill a separate accreditation or approval process. Photovoltaic panels may simply be coupled to existing base tiles and the photovoltaic panels themselves may be shaped and specially adapted to accommodate the differing requirements of each specific application.

Alternatively, it may be advantageous that the base tile is of a larger than standard format/dimension since this may reduce or remove the need to cut standard dimensioned solar cells during manufacture of the roof covering. This may provide cost and/or efficiency savings.

Optionally, the base tile comprises cast concrete. Optionally, the base tile has a relatively high strength and a low weight. The base tile may be shaped to provide enhanced strength while minimising weight. The base tile may comprise ribs to enhance strength of the tile. The ribs may comprise a region of increased thickness. The ribs may be longitudinal ribs.

Optionally, the anchor portion comprises a hook portion. The hook portion may be configured to hook over a part of a roof structure in use.

Optionally, the anchor portion of the base tile is configured to anchor the base tile to a roof baton in use. Optionally, the anchor portion of the base tile is configured to anchor the base tile to a horizontal wooden roof baton in use.

Optionally, the base tile has first and second opposing faces, wherein the first face is adapted to abut a roof structure in use and the second face is adapted to juxtapose the photovoltaic panel. The first face may be the lower face and the second face may be the upper face in use. Optionally, the anchor portion of the base tile is located on the first lower face of the base tile in use. Optionally, the anchor portion is located towards an upper edge of the lower face of the base tile in use.

Optionally, at least one side edge of the base tile has a connecting portion arranged to interconnect the base tile with an adjoining tile. Optionally, opposing side edges of the base tile have complementary interconnecting portions. Optionally, opposing side edges of the base tile have lip and groove interconnecting portions respectively. Therefore, two or more photovoltaic roof coverings laid side by side may be coupled by complementary interconnecting portions.

Optionally, the first lower face of the photovoltaic panel is coupled to the second upper face of the base tile in use.

Optionally, the first lower face of the photovoltaic panel is releasably coupled to the base tile. Releasable coupling of the photovoltaic panel and the base tile has the advantage that the relatively expensive photovoltaic panel may be reused or refitted to another base tile in the event that a base tile is broken or cracked. Such imperfections or breakages are relatively common, where base tiles are manufactured from fragile materials such as concrete, which may be easily broken, cracked or chipped under loading. In this scenario, the more costly photovoltaic panel may be removed from the damaged base tile and reattached to another base tile for re-use.

The first lower face of the photovoltaic panel may be releasably fastened to the base tile. The photovoltaic panel may be releasably fastened using a mechanical fastener such as hooked metallic fixings or clips. Alternatively, the photovoltaic panel may be attached to the base tile by means of complementary interconnectable hook and loop type fasteners, for example, Velcro®, in accordance with the disclosure of U.S. Pat. No. 8,505,249, the entire contents of which are incorporated herein by reference.

Alternatively, the first lower face of the photovoltaic panel is fixed to the base tile. Optionally, the first face of the photovoltaic panel is adhesively bonded to the base tile. Optionally, strips of adhesive are located between the base tile and the photovoltaic panel to bond the base tile and photovoltaic panel.

Optionally, a separator is located between the base tile and the photovoltaic panel to separate the base tile from the photovoltaic panel by a predetermined distance. Optionally, the separator is located towards an edge of the base tile and photovoltaic panel. Optionally, the separator is located around a perimeter of the base tile and photovoltaic panel. Optionally, the separator is attached to an underside of the photovoltaic panel.

Optionally, the separator comprises a rubber material. Optionally, the separator is at least 5 mm thick. Optionally, the separator is at least 8 mm thick. Optionally, the separator is around 10 mm thick. Optionally, the separator comprises a neoprene strip.

The separator is advantageous since it provides a small reliable gap between the base tile and the photovoltaic panel to ensure that the relatively rough surface of the base tile does not come into contact with and/or cause defects to the photovoltaic panel. The separator can also facilitate heat dispersion.

Optionally, the photovoltaic panel is substantially rectilinear with a low profile and the two opposing faces are substantially planar. Optionally, the photovoltaic panel has a smaller width relative to the width of the second face of the base tile.

Optionally, the photovoltaic panel is bonded to the second face of the base tile in an offset relation. Thus, the photovoltaic panel may not be aligned with the second face of the base tile.

Optionally, the photovoltaic panel overhangs the second face of the base tile along one side edge. Optionally, the photovoltaic panel is inset relative to the second face of the base tile along an opposing side edge. The dimensions of the inset may be greater than the dimensions of the overhang.

Optionally, when two photovoltaic roof coverings are laid side by side, a longitudinal gap is created between the inset of one roof covering and the overhang of the adjacent roof covering. Optionally, the longitudinal gap is a drainage channel.

Optionally, where the separator is attached to the underside of the photovoltaic panel, the separator is positioned to at least partially reside under said overhang of the photovoltaic panel such that when two photovoltaic roof coverings are laid side by side, the underside of the separator of one roof covering is in abutment with an upper surface of the inset of the other roof covering base tile in order to at least partially seal the edge of the longitudinal gap from the ingress of fluid therebetween.

Optionally, the photovoltaic panel extends beyond the second face of the base tile at a leading upper edge. The leading edge may be the upper edge of the photovoltaic roof tile in use. Optionally, the photovoltaic panel has a greater length than the length of the base tile. Thus, the photovoltaic panel may overhang the upper end of the base tile.

Optionally, the photovoltaic roof tile comprises an electronics recess. Optionally, the electronics recess is a protected area for housing electronics associated with the photovoltaic panel. The electronics recess may be protected by a portion of the first lower side of the photovoltaic panel and an end face of the leading edge of the base tile. Thus, the electronics recess may be created by the overhang resulting from the extended length of the photovoltaic panel compared with the base tile. Optionally, the electronics recess may house at least one of the following: a junction box, cables, wires, and connectors.

The electronics recess is advantageous since it provides a protected space for the physical electrical connectors from the photovoltaic panel in an area sheltered from weather. In addition, the electronics recess results from an overhang of the photovoltaic panel, which is created by pre-selecting the dimensions of the photovoltaic panel without any modifications to the base tile. The electronics recess accommodates the electronics and provides an area to draw power output from photovoltaic cells within the photovoltaic panel. Conventional solutions for recovering power from the photovoltaic cells require the drilling of holes to embed wires within the base tile. The conventional approach substantially weakens the tile and can compromise the structural integrity thereof. It can also increase the risk of leaks—especially where any issues have been encountered during installation. The present solution has the further advantage that there is no requirement during installation for complicated routing of electric wires, which is time consuming and increases scope for error during installation. The solution of the present invention allows the electronics to be easily connected below the lower face of the upper end of each photovoltaic panel.

The spacer is adhesively bonded to the second upper face of the photovoltaic panel. The spacer is located towards an upper leading end of the photovoltaic panel. The spacer is located towards an upper end of the second upper face of the photovoltaic panel in use.

Optionally, the spacer may be bonded along a strip of the second face of the photovoltaic panel. Optionally, the spacer may be bonded along a lateral strip covering at least a portion of the width of the second face of the photovoltaic panel. The spacer may be bonded along at least 50% of the width of the photovoltaic panel. Optionally, the spacer is bonded along at least a portion of the predetermined contact area with an adjacent tile. Optionally, the spacer comprises a support strip bonded along the full width of the second upper face of the photovoltaic panel.

Optionally the thickness of the spacer is selected such that the spacer supports an overlaid upper tile in an appropriate position to ensure that a lower surface of the overlaid base tile is spaced from the photovoltaic panel along its full length. It is advantageous that the rough base tile does not make direct contact with any part of the photovoltaic panel, which is easily scratched and fragile. Optionally the spacer has a width from longitudinal edge to longitudinal edge of at least 10 mm. Optionally, the spacer has a width from longitudinal edge to longitudinal edge of at least 15 mm. Optionally, the spacer has a width from longitudinal edge to longitudinal edge of at least 18 mm. Optionally the spacer has a width from longitudinal edge to longitudinal edge of around 20 mm.

Optionally, the spacer comprises a rubber strip. Optionally, the spacer comprises a neoprene strip. Optionally, the spacer comprises a neoprene strip having adhesive provided on one side thereof for bonding to the photovoltaic panel.

Optionally, the base tile may comprise a custom-made base tile. Optionally, the spacer is integrated with the structure of the base tile. Optionally, the base tile may comprise a standard or larger than standard format.

Optionally, at least two photovoltaic roof coverings are overlaid in use on a roof such that the upper photovoltaic roof covering is supported by the spacer of the lower photovoltaic roof covering and a part of the roof. Therefore, the upper photovoltaic roof covering is spaced from and does not make direct contact with the photovoltaic panel of the lower roof covering.

According to a second aspect of the invention, there is provided a roof covering comprising:
- a base tile having a first substantially planar upper face and a second opposing lower face, the base tile comprising,
- an anchor portion located towards one end of the second lower face and configured to anchor the base tile to part of a roof structure in use, and
- a connecting portion configured to connect the base tile to an adjacent base tile in use; and wherein the roof covering further comprises,
- a substantially rectilinear photovoltaic cover panel having upper and lower opposing faces and a width that is smaller relative to a width of the first planar upper face of the base tile; and
- a spacer adhesively bonded to the upper face of the photovoltaic cover panel towards an upper leading end of the upper face;
- wherein the base tile and the photovoltaic cover panel are arranged such that side edges of the photovoltaic cover panel are offset relative to side edges of the first upper planar face of the base tile, to thereby create an inset at one side edge and an overhang of the photovoltaic cover panel at the opposing side edge, and wherein the base tile and the photovoltaic cover panel are coupled in this offset configuration.

Optionally, at least two roof coverings according to the second aspect of the invention are provided and interconnected at the connecting portions to create a drainage channel therebetween. Optionally the drainage channel is located between the inset side edge of the cover panel and the overhang of the cover panel of the adjacent roof covering. Optionally, the drainage channel provides a conduit allowing for the removal of precipitation on the roof.

Optionally, the anchor portion comprises a hook portion for hooking over part of a roof structure to anchor the roof covering thereto in use. Optionally, the base tile is a standard cast concrete base tile.

Optionally, the base tile and the cover panel are releasably coupled. Alternatively, the base tile and the cover panel are fixed to one another.

Optionally, the connecting portion of the base tile comprises a complementary connecting portion such that each tile interconnects with an adjacent tile when laid side by side in use. Optionally, the connecting portion of the base tile comprises two complementary connecting portions located on opposing sides of the base tile such that each tile interconnects with an adjacent tile when laid side by side in use. Optionally, the complementary connecting portion comprises a groove portion at one side edge and a complementary lip portion at an opposing side edge. The groove and lip portions are shaped and configured to interconnect. Optionally, the groove and lip portions are configured to provide a channel therebetween to act as a drain for precipitation in the region of the interconnect between adjacent tiles in use.

Optionally, the photovoltaic panel comprises solar cells for the conversion of light energy into electrical energy.

Alternatively, the cover panel is a coloured plastic cover or any alternative cover panel, provided for aesthetic reasons or as a means for generating energy.

Any and all combinations of optional features of the first aspect of the invention may be used in conjunction with and applicable to the second aspect of the invention where appropriate.

The invention of the first and second aspects may also be utilised with a photovoltaic roof covering comprising a multi-layer composite, wherein at least one layer of the multi-layer composite is selected and configured to impart a predetermined colour to the appearance of the roof covering.

According to a third aspect of the invention, there is provided a roof comprising a plurality of photovoltaic roof coverings according to either of the first or second aspects of the invention.

Any of the first, second, and/or third aspects of the invention may be combined with any other aspect, embodiment or feature of the invention described herein, where appropriate.

Further features and advantages of the first, second, and third aspects of the present invention will become apparent from the claims and the following description.

Embodiments of the present invention will now be described by way of example only, with reference to the following diagrams, in which:

FIG. 1 is a plan view of a photovoltaic roof tile;

FIG. 2 is a sectional view of the photovoltaic roof tile along the section A-A shown in FIG. 1;

FIG. 3 is a sectional view of the photovoltaic roof tile along the section B-B shown in FIG. 1;

FIG. 9 is a perspective view of three overlaid photovoltaic roof tiles; and

FIG. 13A is an underside plan view of a larger than standard format photovoltaic roof tile;

FIG. 13B is a transverse sectional view of the photovoltaic roof tile of FIG. 13A;

FIG. 13C is a more detailed illustration of an integrated spacer feature of the roof tile of FIGS. 13A and 13B;

A photovoltaic roof covering in the form of a solar roof tile is shown generally at 10 in the attached figures. The solar roof tile 10 is shown in differing views in FIGS. 1-4 and comprises a base tile 11, a photovoltaic panel 20 and electronics 24.

Figure 4:
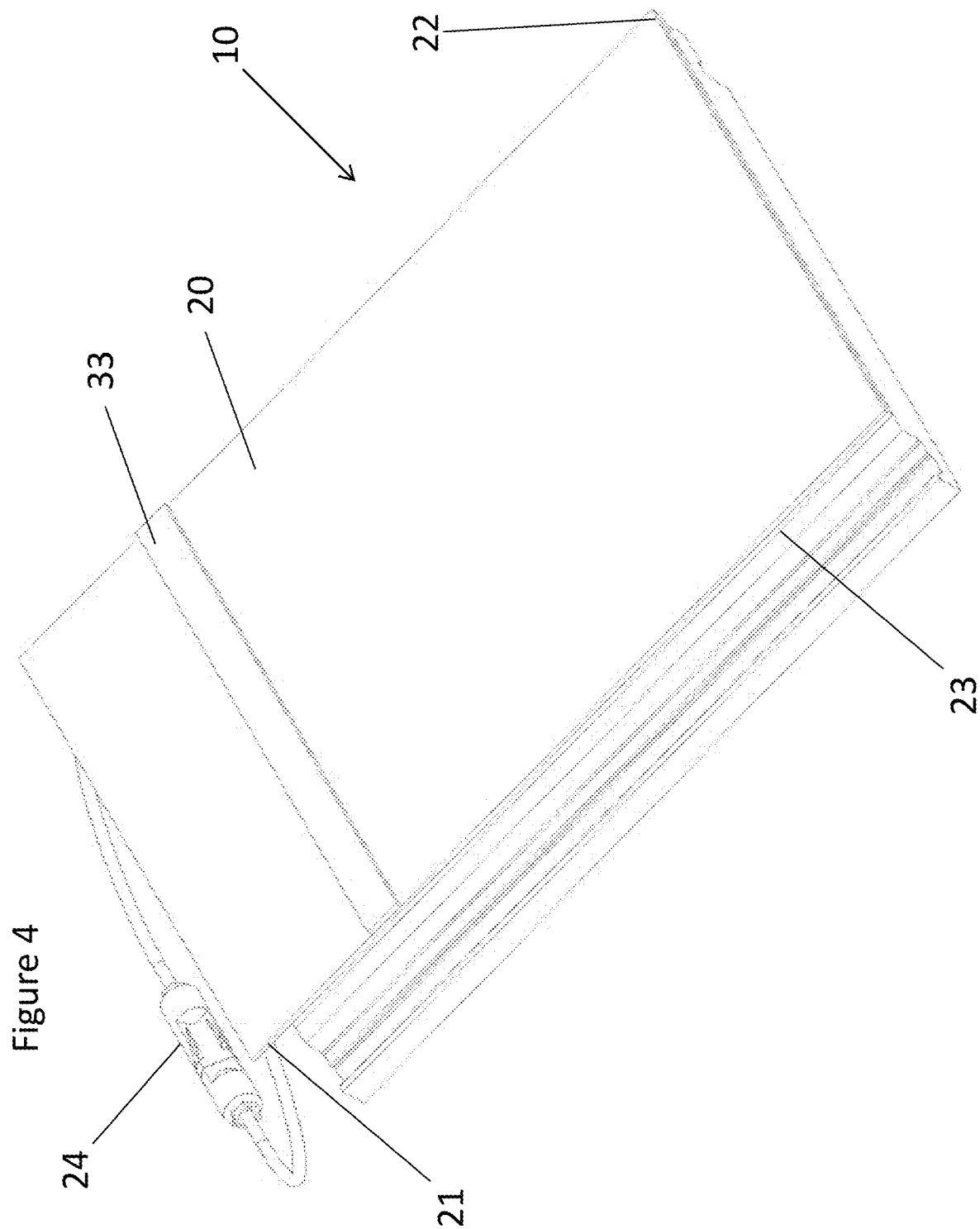
FIG. 4 is a perspective view of the photovoltaic roof tile of FIG. 1.
Figure 5:
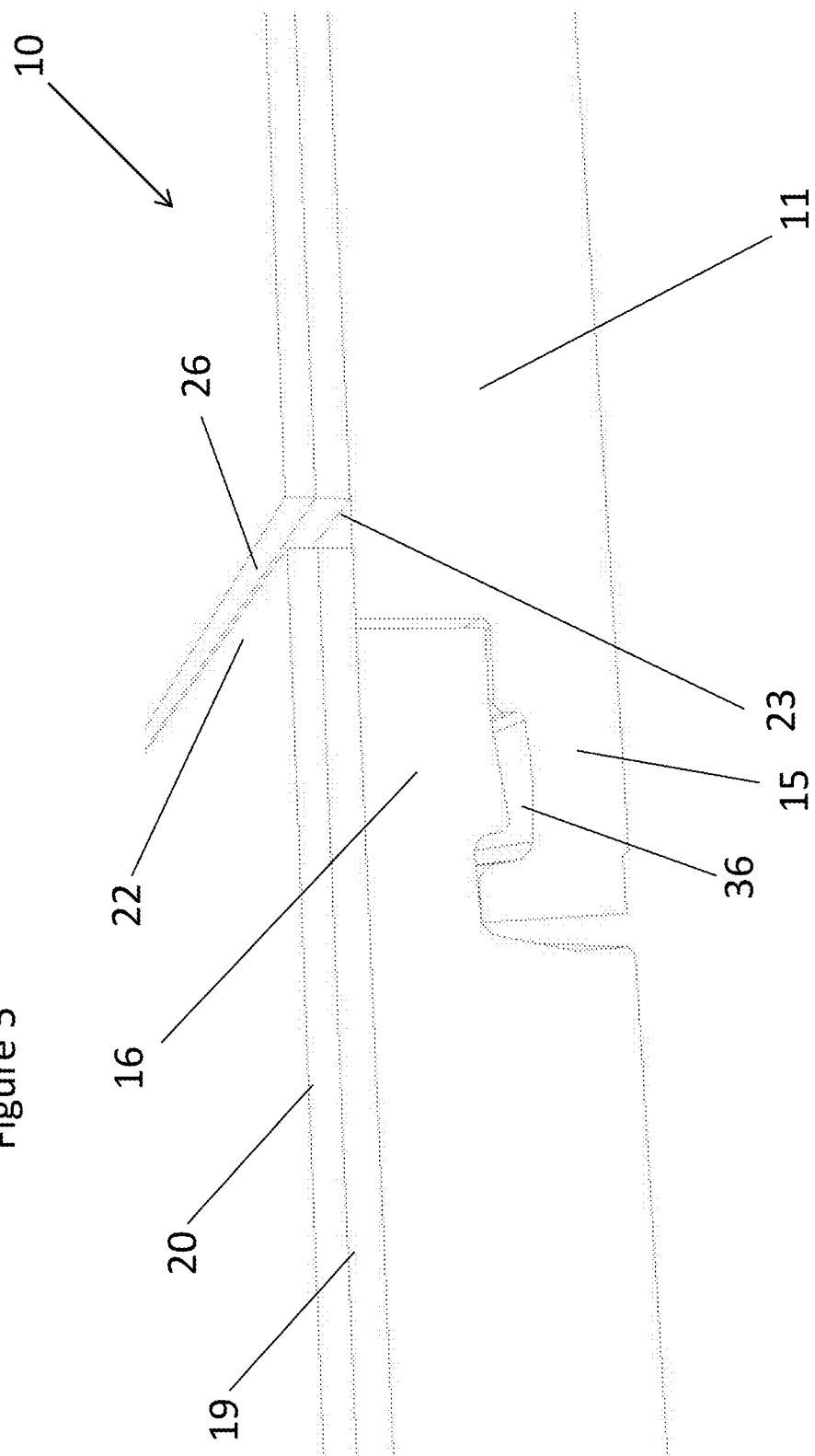
FIG. 5 is a perspective end view of part of two interconnected photovoltaic roof tiles.
Figure 6:
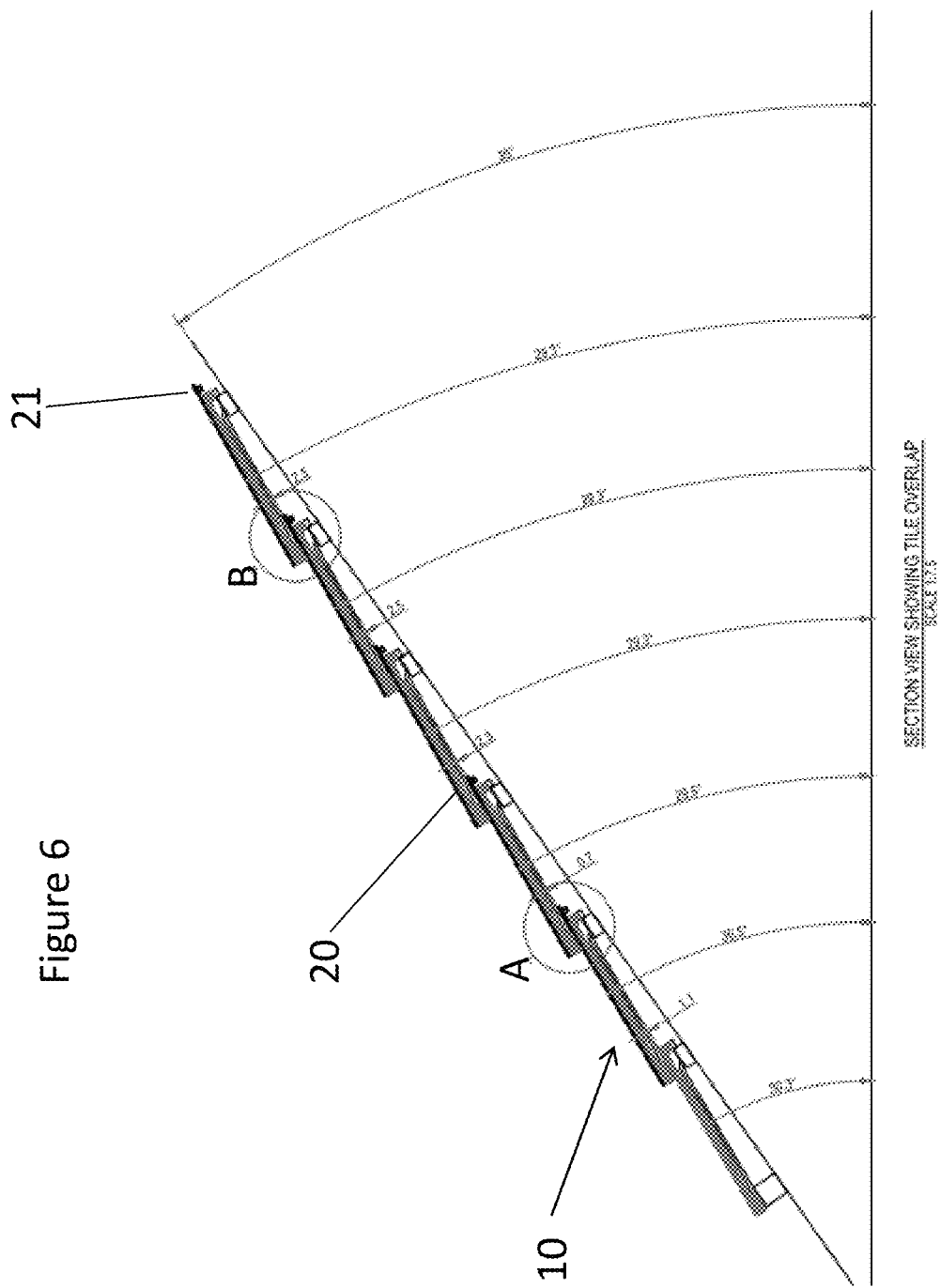
FIG. 6 is a sectional view of a plurality of overlaid photovoltaic roof tiles in position on a roof.

The base tile 11 is cast from concrete. The base tile 11 has a substantially planar rectilinear upper face and an opposing lower face having longitudinal ribs 14 of increased thickness to improve strength of the base tile 11 whilst reducing mass. As shown in FIG. 2, a first side edge of the base tile 11 has an interconnecting groove 15 extending along the length thereof. A second opposing side edge has an interconnecting lip 16 extending along the length thereof. The interconnecting groove 15 and lip 16 are shaped to form an interlock between adjacent tiles 10 when two such solar roof tiles 10 are laid side by side as will be described subsequently. As shown in FIG. 5, the thickness and profile of the lip 16 and the depth of the groove 15 are marginally mismatched such that a tile drainage channel 36 is created therebetween when a first tile is interlocked to a second tile so as to provide a conduit for the transportation of precipitation away from a roof and towards a gutter or downpipe in use.

Figure 11:
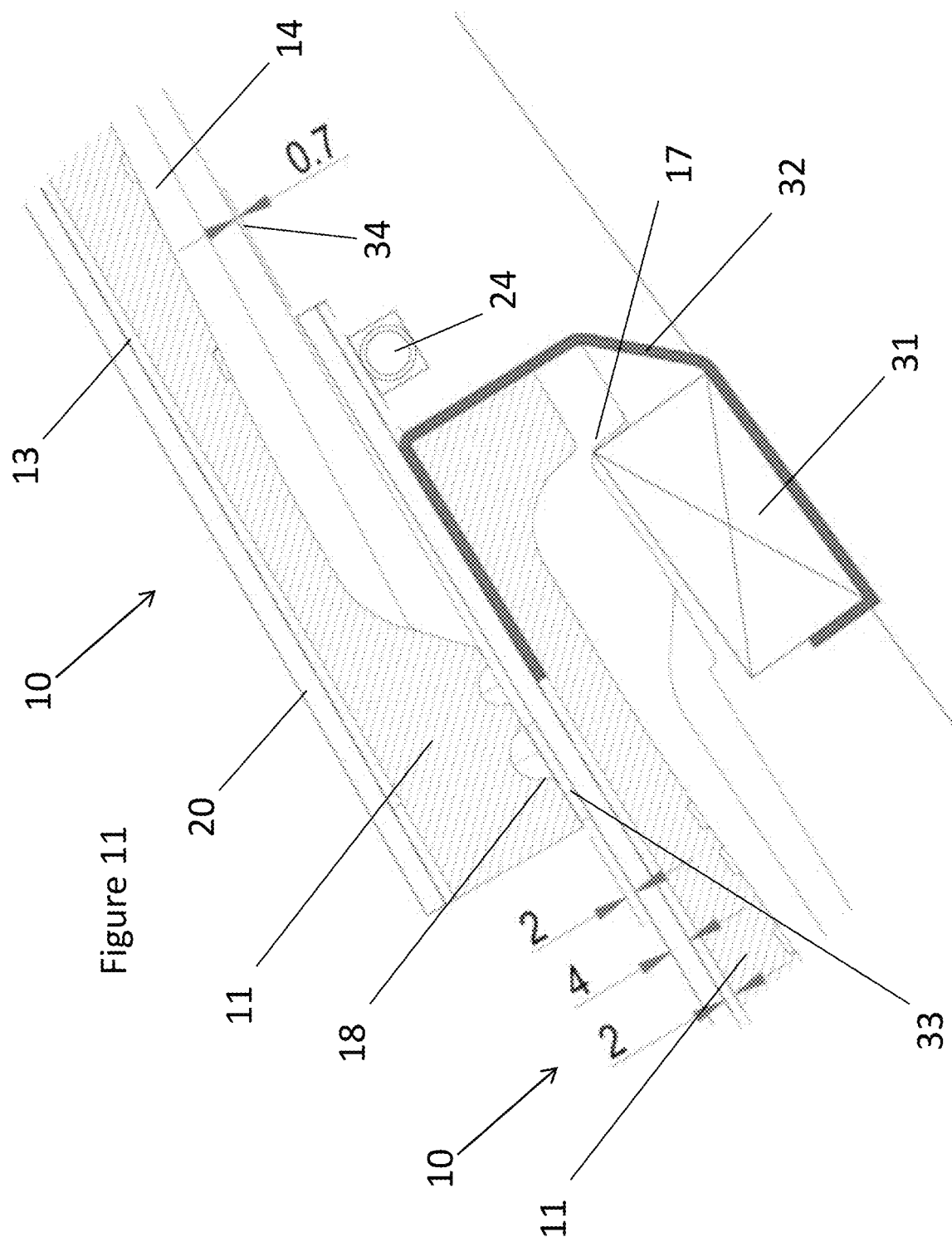
FIG. 11 is a sectional view of part of two photovoltaic roof tiles overlaid and in position on a roof wherein the lower tile is clipped to a roof baton.

As shown in FIG. 3, an upper end of the underside or lower face of the base tile 11 is provided with an anchor or hook portion 17 that is arranged to hook over an edge of a truss or wooden baton 31 (FIG. 11) of a roof in use. An opposing lower end of the base tile 11 has a profiled portion 18 that supports the solar roof tile 10 on a lower tile 10 in use.

In the present embodiment, the base tile 11 is of a standard construction and complies with existing dimensional, strength and regulatory requirements in the region of use, such that the solar roof tile 10 of the present invention may be used in place of standard tiles without requiring recertification or modification to existing roof structures. This also means that solar roof tiles 10 of the invention may be used to replace existing tiles or may be retrofitted to existing roof coverings.

The solar tile 10 of the present invention comprises a photovoltaic panel 20. The photovoltaic panel 20 includes a plurality of photovoltaic cells that are electrically connected and encapsulated within the multi-layer composite panel 20. Each solar cell is capable of receiving light energy from the sun and converting this into electrical energy using the photoelectric effect as is well known and documented in the art.

The photovoltaic panel 20 is a substantially low profile rectilinear multi-layer module having a slightly smaller width and a greater length relative to the upper planar face of the base tile 11 to which the photovoltaic panel 20 is attached. According to the present embodiment, the photovoltaic panel 20 is designed to colour match the surrounding standard roof tiles which are dark grey in colour.

Figure 12:
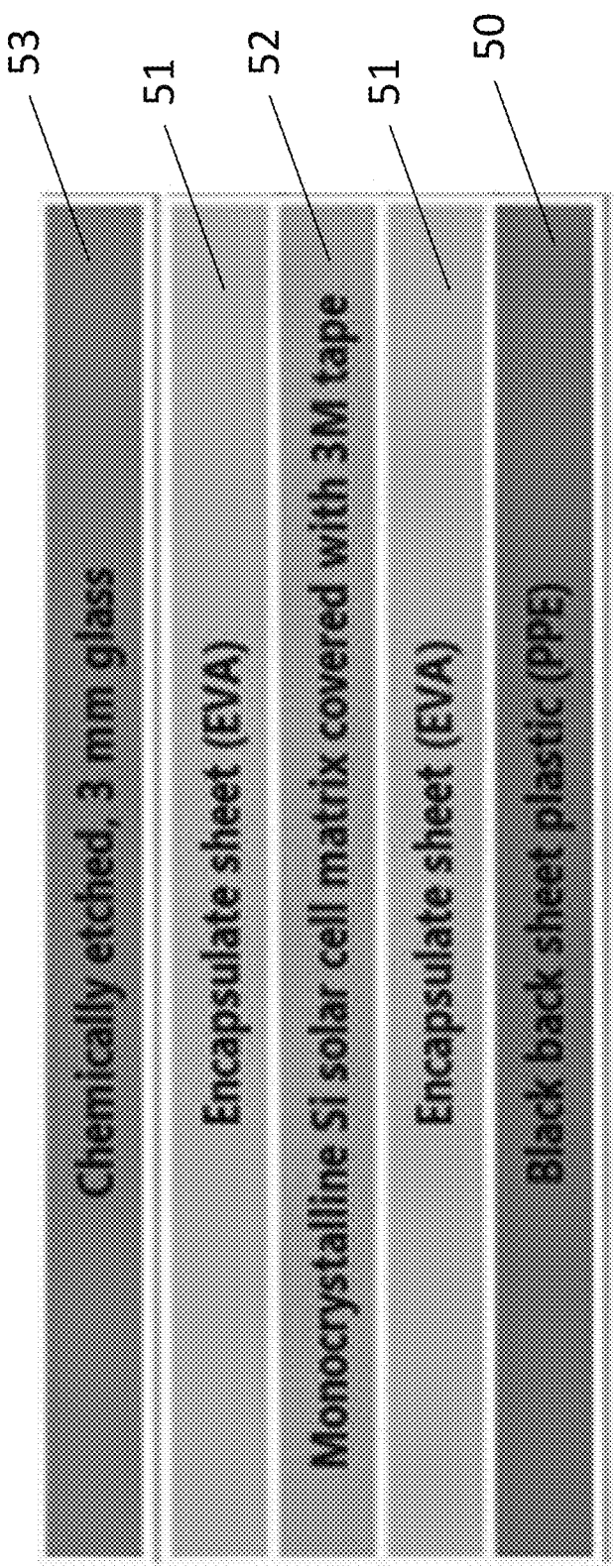
FIG. 12 is a schematic diagram of a multi-layer composite for a colour-matched photovoltaic panel.

As shown in FIG. 12, the photovoltaic panel 20 comprises several layers of different materials and components. A base layer 50 or backing layer comprises a black plastic sheet of PPE (polyphenylene ether). This imparts a dark colour to the panel 20 (in the specific embodiment this may be RAL 7016 Anthracite Grey; however, of course many other specific colours/tones may be provided as desired). Above the PPE base layer 50, there is a protective polymeric layer in the form of an EVA (ethylene vinyl acetate) encapsulate sheet 51. A photovoltaic layer in the form of a monocrystalline silicon solar cell matrix 52 covered with suitable black/dark coloured tape is sandwiched between the lower protective polymeric layer and another similar upper layer of EVA encapsulate sheet 51. The solar cells within the matrix 52 are stringed in series using interconnecting ribbons, which are then covered with suitable dark tape for a 'full black' appearance. The layers of EVA encapsulate sheet 51 provide a resin barrier to protect the solar cell matrix layer 52. An upper or cover layer of chemically etched 3 mm glass 53 is laid atop to impart a dark colour to the panel 20.

All layers 50, 51, 52, 53 are prepared and cut to the desired dimensions of the photovoltaic panel 20. Thus, the layers 50, 51, 52, 53 have a slightly smaller width and a greater length than the dimensions of the planar upper face of the base tile 11. The layers 50, 51, 52, 53 are assembled on top of one another in a pre-laminate as shown in FIG. 12 and in accordance with the tolerances required for the photovoltaic panel 20. The pre-laminate is then inserted in a membrane type vacuum laminator where polymerisation of the EVA encapsulate sheet 51 is achieved by maintaining the panel 20 at a temperature of around 160° C. for twenty minutes. Following lamination, the EVA layers 51 become substantially transparent such that the photovoltaic panel 20 appears a dark grey colour adapted to match the colour of surrounding tiles. Thus, the multi-layer composite allows light to be transmitted through the glass layer 53 and the transparent resin layer 51 to the solar cell matrix 52. The layers of the composite also serve to protect the solar cell matrix 52 from prevailing weather and other environmental harm.

According to the present embodiment, the resulting photovoltaic panel 20 is measured as RAL 7016 Anthracite Grey using an electronic colour meter. Thus, the above method of manufacture allows the colour of the photovoltaic panel 20 to be modified to colour match the surrounding tiles.

According to alternative embodiments the surrounding tiles may be different colours, such as russet, red, orange, brown and black, and therefore components of the previously described composite may be modified to achieve the desired aesthetic. Examples of how this might be achieved include either by selecting differently coloured plastic backing 50 and/or a different appearance of glass layer 53.

Prior to attachment of the base tile 11 and the photovoltaic panel 20, the lower edge of the photovoltaic panel 20 is aligned with the lower edge of the base tile 11. Given the greater length of the photovoltaic panel 20, such lower edge alignment results in an upper edge overhang of the photovoltaic panel 20 relative to the base tile 11. This overhang creates an electronics recess or protected area defined by the lower face of the photovoltaic panel 20 in the region of the overhang and the end edge of the base tile 11. The protected area provides a recess or storage area for the electronics 24 such as the junction box, cables and connectors for the transfer of power generated by each solar tile 10. Cables from the photovoltaic panels 20 may extend to a junction box or other receiving station where the electric current may be conditioned and made available for use, or stored in a battery system.

With particular reference to FIG. 5, side edges of the photovoltaic panel 20 are not aligned with side edges of the base tile 11. Rather, a first side edge of the photovoltaic panel 20 is inset from the side edge of the upper planar face of the base tile 11. At the opposing side edge, the photovoltaic panel 20 overhangs 22 the side edge of the base tile 11. The inset 23 is greater than the overhang 22 such that when the solar tiles 10 are laid side by side and interconnected, a solar drainage channel 26 is created. The solar drainage channel 26 is around 1 cm wide and designed to create a larger conduit than the standard base tile 11 drainage channel 36. As a result, the solar drainage channel 26 can accommodate greater volumes of precipitation that are required to drain away from the roof covering in use. Furthermore, the solar drainage channel 26 is staggered relative to the standard tile drainage channel 36, reducing the likelihood of water ingress through the tiles 10 to compromise the integrity of the roof.

According to the present embodiment, the photovoltaic panel 20 and the base tile 11 are adhesively bonded in the offset configuration described above. Alternatively, the photovoltaic panel 20 may be attached to the base tile 11 by means of complementary interconnectable hook and loop type fasteners, for example, Velcro®, in accordance with the disclosure of U.S. Pat. No. 8,505,249. As shown in FIG. 1, a separator in the form of a 4 mm neoprene single-sided adhesive strip 19 is applied around a perimeter of the lower face of the photovoltaic panel 20. The adhesive strip 19 is located towards the edges of the join between the photovoltaic panel 20 and the base tile 11 to ensure that there is adequate spacing between the base tile 11 and the photovoltaic panel 20. The adhesive strip 19 ensures that the base tile 11 and the photovoltaic panel 20 do not contact one another so that the relatively rough hard surface of the concrete base tile 11 does not damage or otherwise mechanically interfere with the relatively smooth and fragile photovoltaic panel 20. The adhesive strip 19 may also facilitate heat dispersion. The base tile 11 and the photovoltaic panel 20 are bonded by adhesive 13 placed in strips between the lower face of the photovoltaic panel 20 and the upper planar face of the base tile 11. Alternatively, patches or drops of adhesive may be applied wherever required on between the base tile 11 and the rear of the photovoltaic panel 20. The adhesive bonding process between the base tile 11 and the photovoltaic panel 20 may be completed offsite in a factory or warehouse setting, thereby advantageously saving time during installation. Furthermore, a clean offsite environment may result in better attachment and improved bonding between the photovoltaic panel 20 and the base tile 11 by minimising the risk of impurities in the bond between the two components.

According to alternative embodiments, the photovoltaic panel 20 and the base tile 11 is releasably coupled using mechanical fasteners. One alternative example includes complementary interconnecting hook and loop type fasteners that are provided on both the photovoltaic panel 20 and the base tile 11. Another example is the use of clips to releasably attach the base tile 11 and the photovoltaic panel 20. Releasable coupling can be advantageous in the event that the base tile 11 is cracked or otherwise damaged and has to be discarded. The relatively expensive photovoltaic panel 20 may be released from the damaged base tile 11 and reattached to another base tile 11 such that the photovoltaic panel 20 is not needlessly wasted and discarded with the damaged base tile 11.

An upper surface of the photovoltaic panel 20 has a spacer bonded thereto towards its upper end in the form of a strip of single sided adhesive neoprene 33. The neoprene strip 33 is around 4 mm thick, 20 mm across its width from one longitudinal edge to the other longitudinal edge and extends along the entire width of the photovoltaic panel 20. As a result, the neoprene strip 33 provides a narrow continuous spacer along the photovoltaic panel 20 to support the underside of an overlaid tile. The neoprene strip 33 ensures that overlaid tiles do not come into direct contact with the underlying photovoltaic panel 20 and the strip 33 supports an overlaid tile such that the overlaid tile is spaced from the underlying photovoltaic panel 20 along its entire length.

According to the present embodiment, the solar tiles are pre-prepared off-site and colour matched as described hereinbefore to a dark grey colour prior to installation on a roof. The pre-prepared solar tiles 10 are then transported to a roof on which they will be installed.

A typical roof includes an A-frame with roof trusses, a waterproof membrane, insulation and horizontal batons 31. As shown in FIGS. 6-8 and 11, the hook portion 17 of each solar tile 10 is used to anchor the tile 10 to a suitable roof truss or horizontal baton 31. According to the embodiment shown in FIG. 11, a clip 32 may be used to secure the attachment of the hook portion 17 against the baton 31.

Figure 10:
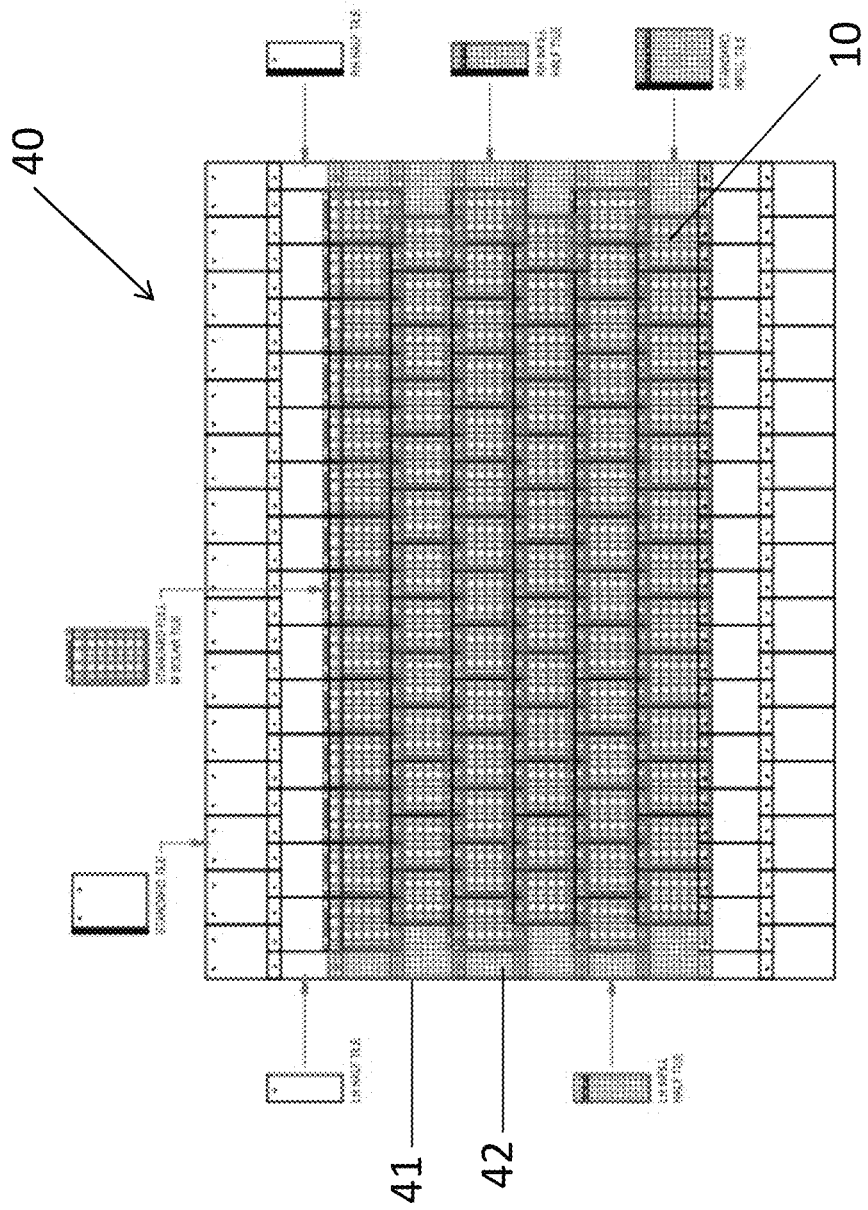
FIG. 10 is a plan view of a roof comprising a combination of photovoltaic colour-matched roof tiles and standard roof tiles.

The solar tiles 10 are laid out in a grid like pattern 40 to maximise weather resistance as shown in FIG. 10. The solar tiles 10 provide the roof with further protection from the weather and prevent damage to, or puncture of, the underlying membrane. The solar tiles 10 interconnect in a side-by side relationship by means of the interconnecting lip 16 and groove 15. Upper rows of tiles 10 are staggered and positioned centrally over the join between lower rows of tiles 10 as shown in FIGS. 9 and 10 to provide further protection from the weather. This overlying interlocking configuration substantially restricts solar tile 10 movement during high wind conditions.

Figure 8:
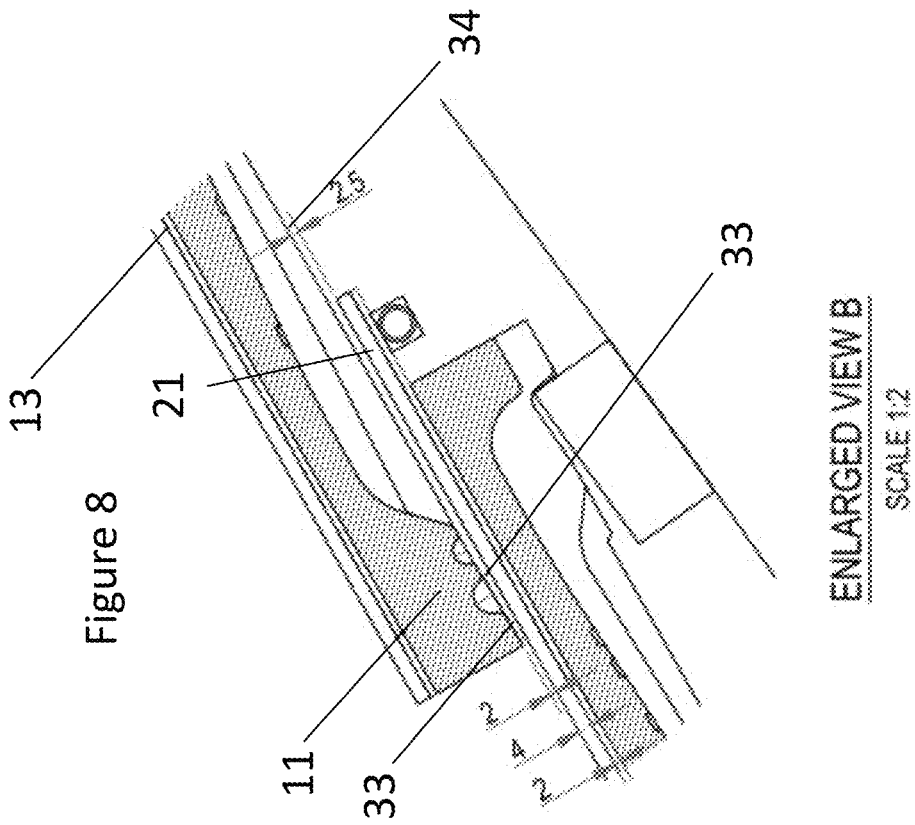
FIGS. 7 and 8 are enlarged sectional views of portions A and B respectively, from FIG. 6.

The lower profiled underside 18 of each base tile 11 rests on the neoprene strip 33 of the solar tile 10 therebelow. Therefore, the concrete base tile 11 is not resting on the fragile glass layer 53 of the photovoltaic panel 20. In addition, the neoprene strip 33 acts as a spacer to lift the underside of each base tile 11 away from the overhang 21 at the upper end of the photovoltaic panel 20. The unsupported overhang 21 at the upper end of each photovoltaic panel 20 is particularly vulnerable to damage from the relatively heavy and rough base tile 11. With reference to FIG. 8, the spacer function of the neoprene strip 33 acts to open a gap 34 between overlaid solar tiles 10 and space the overhang 21 of the photovoltaic panel 20 from the underside of each base tile 11.

Figure 7:
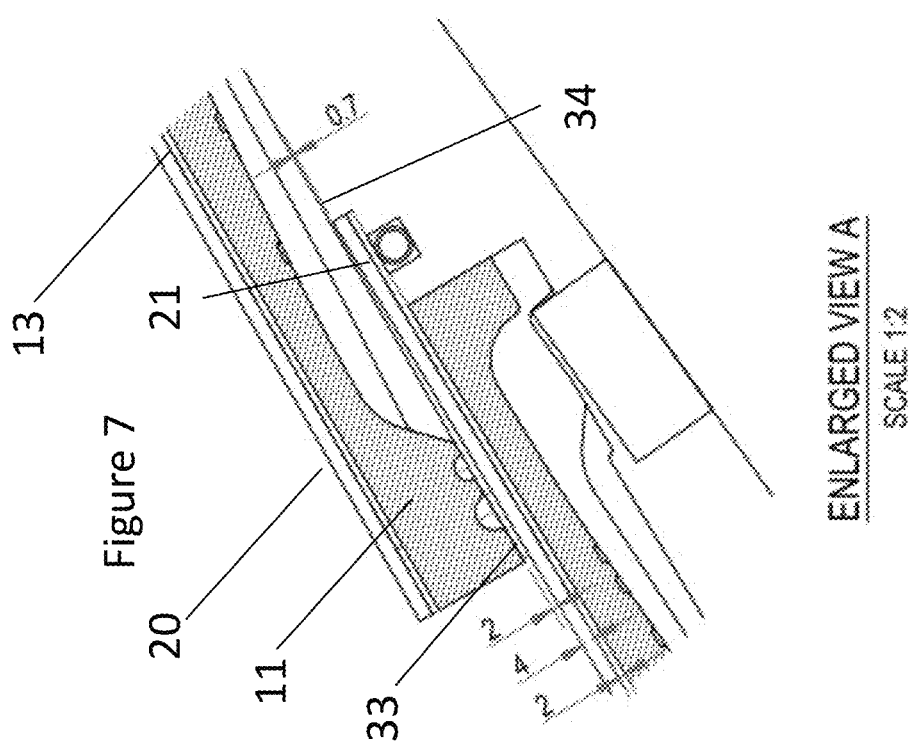

As shown in FIGS. 7 and 8, the dimensions of the gap 34 alter according to the solar tile 10 position on the roof. The lower solar tiles 10 have a narrower gap 34 (as illustrated in FIG. 7) compared with the solar tiles 10 higher on the roof (as illustrated in FIG. 8). Therefore, the thickness and position of the spacer strip 33 are carefully selected to ensure that, even at the most acute angle of solar tile 10 position, there remains a sufficient gap 34 to space the underside of each base tile 11 from the photovoltaic panel 20 beneath.

Opening such a gap 34 between overlaid tiles 10 can be problematic and counterintuitive, since gaps can create a leak path for precipitation and moisture on the roof. No water ingress is desirable for a roof covering and furthermore, solar tiles 10 are particularly vulnerable to water damage given the proximity of vital electronic components to the roof tiles 10. However, provision of the neoprene spacer strip 33 along the full width of the void provides a weather resistant barrier that allows the system to conform to required regulations and specifications in the construction industry.

The photovoltaic panels 20 of each of the plurality of solar tiles 10 on the roof may be connected in series to create an additive voltage. The electronics 24 located in each electronics recess are joined along the underside of the roof to collect the power output from the photovoltaic panels 20. The power output may be drawn away from the roof and conditioned for immediate use or storage.

As shown in FIG. 10, the functioning solar tiles 10 are used to cover only part of the roof, with some dummy full tiles 41 and dummy half tiles 42, utilised along the edges, above and below the functioning solar tiles 10. The use of these dummy tiles 41, 42 forms a continuous visual appearance over the whole of the resultant roof. Indeed, if desired, all tiles on the roof may include the solar tiles whether or not those solar tiles are functional. In other words, in areas (typically around the periphery of the roof profile) where it is not possible or desirable to provide functioning solar roof tiles (perhaps due to the need to cut such tiles when arranging them on the roof profile) such solar roof tiles may in any case be provided, but not electrically connected to the system. This ensures that an identical visual appearance is provided over the entire surface of the roof. This hence results in there being no visual contrast between the active main surface roof tiles and the inactive periphery roof tiles, and this contributes to the desirable aesthetics of the resultant roof covering by ensuring that there is no visual distinction between the two. As an alternative, rather than all tiles being solar tiles, a similar overall visual effect may be achieved by providing inactive tiles which are provided with an appropriate coating, or comprise only certain components of the neighbouring active solar tiles, in order to retain the same or similar visual appearance in those inactive tiles as the neighbouring active tiles and hence achieve the same or similar overall visual effect as that previously described.

Figure 14:
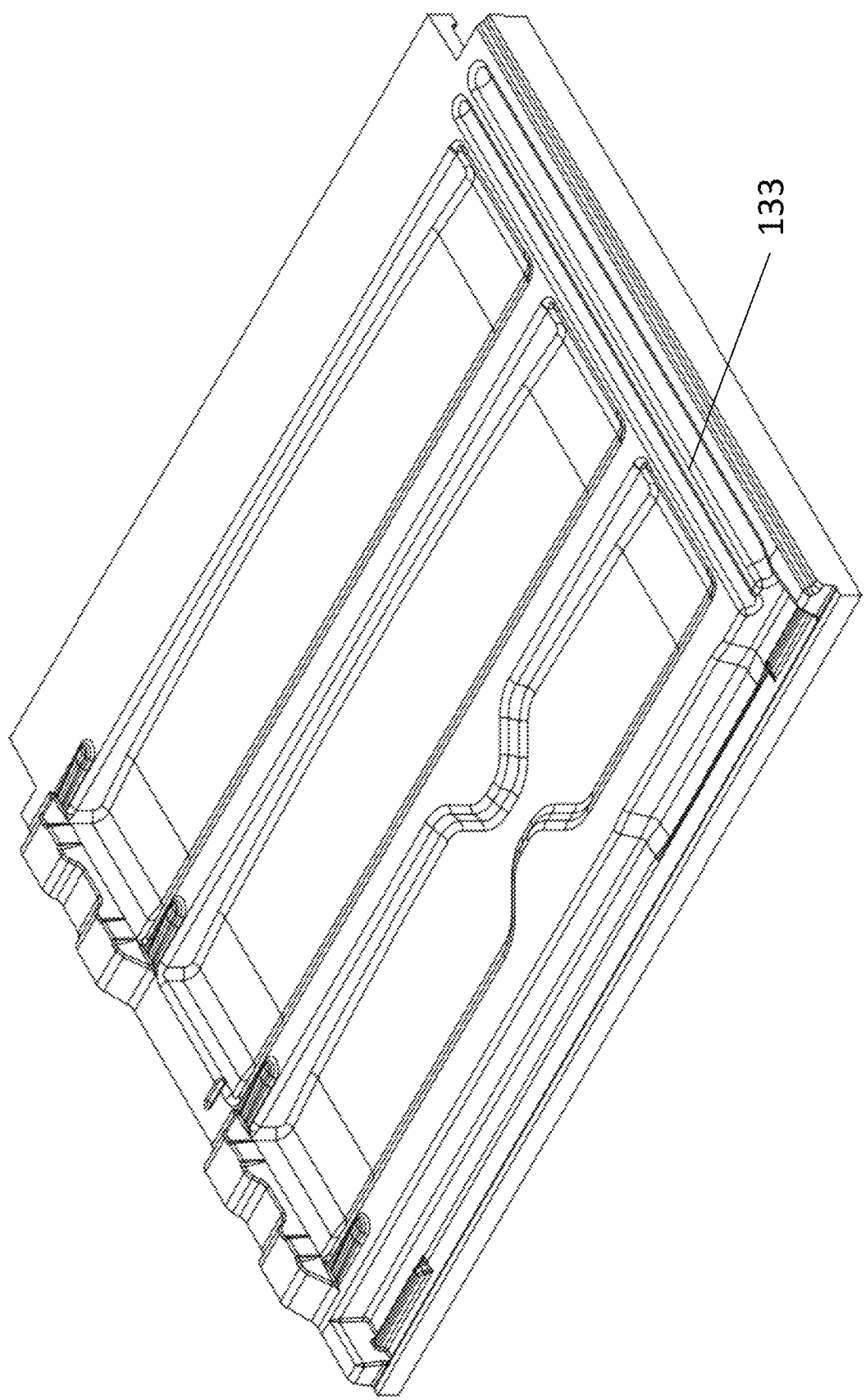
FIG. 14 is a perspective illustration of the roof tile of FIGS. 13A to 13C.
Figure 15A:
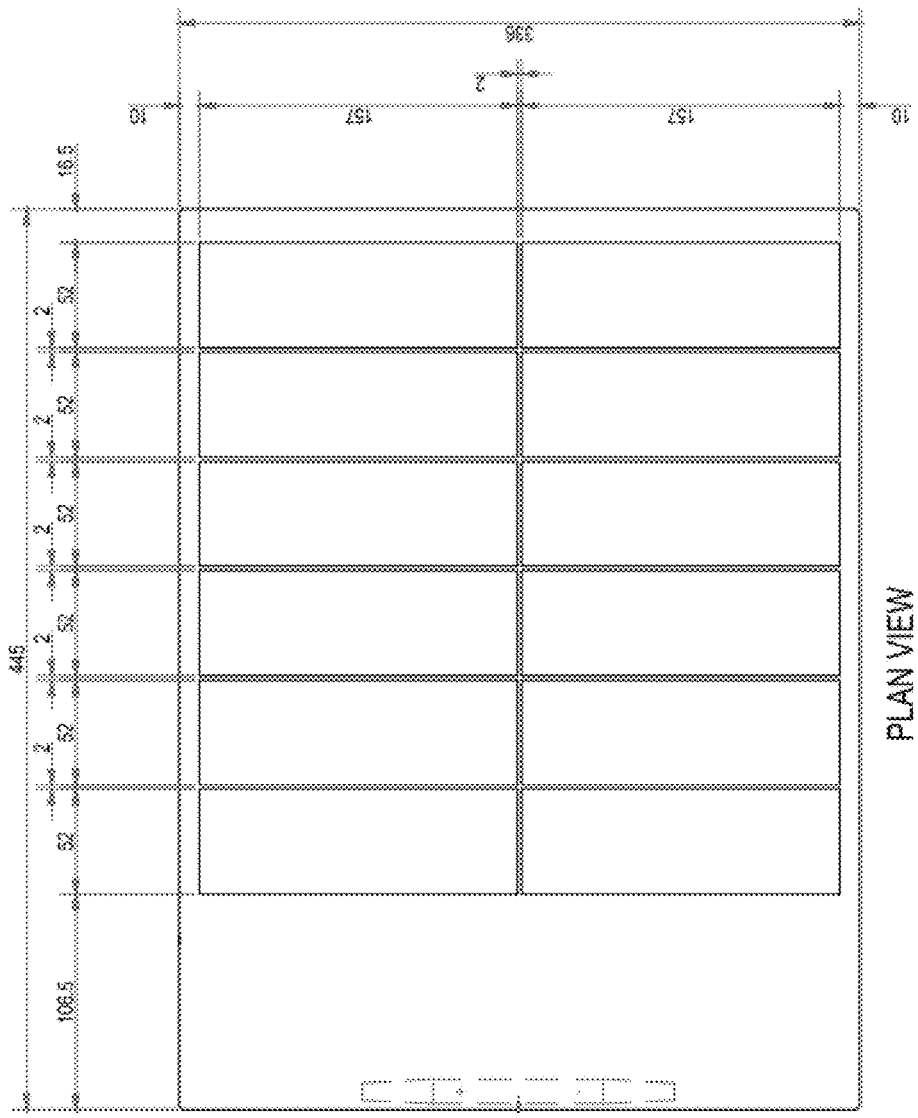
FIG. 15A is a plan view of the solar roof covering illustrating a series of uncut standard dimension solar cells positioned thereon in a matrix formation.
Figure 15B:
FIG. 15B is a transverse illustration of the roof covering of FIG. 15A

With reference to FIGS. 13 to 14, in an alternative embodiment, the base tile may be of a larger than standard format in order to accommodate a set of solar cells which do not require to be cut during manufacture of the roof covering. In this specific embodiment, the roof tile may be of a width of at least 336 mm in order to accommodate a pair of solar cells side by side which are of a standard solar cell dimension (each typically 157 mm in width). However, alternative format and dimensions of roof tile and solar cell may alternatively be utilised.

With such an arrangement, and with particular reference to FIG. 13C, since the base tile is custom-made the base tile design can also be adapted during manufacture thereof in order to provide an integrated spacer 133 along the lower edge of the base tile. This spacer 133 may take the place of, and provide similar mechanical advantages to, the previously described mechanically separate neoprene or other spacer strip 33 otherwise provided on the upper face of the roof covering. Alternatively, this spacer 133 may be complementary to the previously described mechanically separate neoprene or other spacer strip provided on the upper face of the roof covering. In other words, the integrated spacer 133 may be rested upon a mechanically separate neoprene or other spacer strip also provided on the upper face of the roof covering below if desired. Where the base tile is custom-made it may also be made to a standard or larger than standard format if desired.

Although particular embodiments of the invention have been disclosed herein in detail, this is by way of example and for the purposes of illustration only. The aforementioned embodiments are not intended to be limiting with respect to the scope of the statements of invention and/or appended claims. Relative terms such as "upper", "lower", "greater" and "smaller" are used illustratively and are not intended to limit the scope of the invention.

It is contemplated by the inventors that various substitutions, alterations, and modifications may be made to the invention without departing from the scope of the invention as defined by the statements of invention and/or claims. Examples of these include the following:

The solar tiles 10 may be used in conjunction with any roof covering or system.

The base tile 11 may be made from any suitable material (e.g. clay) or comply with the regulatory requirements in any country, jurisdiction or region.

The solar tiles 10 may be different shapes and/or sizes and may include different interconnecting features.

The base tile 11 may be a custom-made roof tile with non-conventional dimensions.

The spacers 33 and separators 19 may be made from other suitable materials and are not limited to rubber-based compounds.

The electronics recess may not contain a junction box.

The final colour of the photovoltaic panel 20 may not be RAL 7016 Anthracite Grey, but may be very similar or very different in colour.

The solar cells 52 used in the photovoltaic panel 20 may not comprise monocrystalline silicon and may instead comprise other appropriate materials such as cadmium telluride (CdTe), copper indium gallium diselenide (CIGS), perovskites, or polycrystalline silicon.

The solar cells 52 used in the photovoltaic panel 20 may comprise a combination of appropriate materials, such as a combination of monocrystalline silicon and perovskites.

The plastic back sheet 50 may be replaced with a different appropriate material, such as Tedlar®.

The chemically etched glass layer 53 may be replaced with a different appropriate material, such as Ethylene tetrafluoroethylene (ETFE).

The previously described dimensions of the previously described components—including e.g. the separators, spacers, channels, gaps and angles are not to be considered limiting and may be altered depending upon the specific application.

The invention claimed is:

1. A photovoltaic roof covering comprising:
a base tile having a top surface, an opposing bottom surface, and an anchor portion, wherein the anchor portion is configured to anchor the base tile to part of a roof in use;
a photovoltaic panel having a first lower face that is configured to face the top surface of the base tile and a second opposing upper face that is arranged to receive light;
wherein the base tile and the photovoltaic panel are coupled to one another in an offset configuration to create an overhang; and
a spacer configured to support a portion of a second overlaid base tile when in use, by spacing the second overlaid base tile from the second upper face of the photovoltaic panel;
wherein the spacer is adhesively bonded to the second upper face of the photovoltaic panel towards an upper leading end.

2. The photovoltaic roof covering according to claim 1, wherein the base tile comprises cast concrete and is shaped to provide enhanced strength with minimal weight.

3. The photovoltaic roof covering according to claim 1, second opposing faces and wherein the anchor portion is configured to hook over a horizontal roof baton in use and is located towards an upper edge of the bottom surface of the base tile.

4. The photovoltaic roof covering according to claim 1, further comprising a separator located between the base tile and the photovoltaic panel to separate the top surface of the base tile from the first lower face of the photovoltaic panel by a predetermined distance.

5. The photovoltaic roof covering according to claim 4, wherein the separator comprises a rubber material having a thickness of at least 4 mm located around a perimeter between the base tile and the photovoltaic panel.

6. The photovoltaic roof covering according to claim 1, wherein the photovoltaic panel overhangs the top surface of the base tile along a first side edge and is inset relative to the top surface of the base tile along an opposing second side edge.

7. The photovoltaic roof covering according to claim 1, wherein the photovoltaic panel extends beyond the top surface of the base tile at a leading upper edge.

8. The photovoltaic roof covering according to claim 6, wherein the spacer is attached to the first lower face of the photovoltaic panel and is positioned to at least partially reside under said overhang of the photovoltaic panel such that when two photovoltaic roof coverings are laid side by side, an underside of the spacer of a first photovoltaic roof covering is in abutment with an upper surface of the inset of a second photovoltaic roof covering in order to provide at least a partial seal therebetween.

9. The photovoltaic roof covering according to claim 1, wherein the spacer is bonded along at least a portion of a predetermined contact area with the second overlaid tile when in use, to space the second overlaid tile from the second upper face of the photovoltaic panel.

10. The photovoltaic roof covering according to claim 1, wherein the spacer comprises a support strip bonded along the full width of the second upper face of the photovoltaic panel.

11. The photovoltaic roof covering according to claim 1, wherein the thickness of the spacer is selected such that the spacer supports the second overlaid tile in an appropriate position to ensure that the lower surface of the second overlaid tile is spaced from the second upper face of the photovoltaic panel along its full length when in use.

12. The photovoltaic roof covering according to claim 1, wherein the spacer at least partially comprises a rubber strip.

13. The photovoltaic roof covering according to claim 1, wherein the spacer at least partially comprises an adhesive neoprene strip.

14. A roof comprising a plurality of photovoltaic roof coverings according to claim 1.

15. A roof covering comprising:
    a base tile having a first substantially planar upper face and a second opposing lower face, said upper face having a first width, the base tile comprising:
        an anchor portion located towards one end of the second lower face of the base tile and configured to anchor the base tile to part of a roof structure in use, and
        a connecting portion configured to connect the base tile to an adjacent base tile in use; and
    wherein the roof covering further comprises:
        a substantially rectilinear photovoltaic cover panel having an upper face and a lower opposing face, said photovoltaic cover panel having a width that is smaller than the first width of the first substantially planar upper face of the base tile; and
        a spacer adhesively bonded to the upper face of the photovoltaic cover panel towards an upper leading end of the upper face;
    wherein the base tile and the photovoltaic cover panel are arranged such that side edges of the photovoltaic cover panel are offset relative to side edges of the first substantially planar upper face of the base tile, to thereby create an inset at one side edge and an overhang of the photovoltaic cover panel at the opposing side edge, such that the base tile and the photovoltaic cover panel are coupled in an offset configuration.

16. The roof covering according to claim 15, wherein the connecting portion of the base tile comprises two complementary connecting profiles located on opposing edges of the base tile such that each base tile may interconnect with the adjacent base tile laid side by side.

17. The roof covering according to claim 16, wherein the complementary connecting profiles comprise a groove profile along one side edge and a complementary lip profile along an opposing side edge, and wherein the groove and lip profiles are shaped and configured to interconnect and provide a channel therebetween to act as a drain for precipitation in the region of the interconnect between adjacent base tiles when in use.

18. The roof covering according to claim 15, wherein, the photovoltaic panel comprises solar cells for the conversion of light energy into electrical energy.

19. Two roof coverings, each roof covering according to claim 15, wherein the two roof coverings are interconnected by the connecting portions and a photovoltaic cover panel drainage channel is created between an inset side edge of one photovoltaic cover panel and the overhang of the photovoltaic cover panel of an adjacent roof covering.

* * * * *